United States Patent
Teng et al.

(10) Patent No.: US 9,673,169 B2
(45) Date of Patent: Jun. 6, 2017

(54) METHOD AND APPARATUS FOR A WAFER SEAL RING

(71) Applicant: Taiwan Semiconductor Manufacturing Company, Ltd., Hsin-Chu (TW)

(72) Inventors: Yi-Chuan Teng, Zhubei (TW); Jung-Huei Peng, Jhubei (TW); Shang-Ying Tsai, Pingzhen (TW); Hsin-Ting Huang, Bade (TW); Li-Min Hung, Longtan Township (TW); Yao-Te Huang, Hsin-Chu (TW); Chin-Yi Cho, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/759,201

(22) Filed: Feb. 5, 2013

(65) Prior Publication Data
US 2014/0220735 A1    Aug. 7, 2014

(51) Int. Cl.
*H01L 21/00* (2006.01)
*H01L 23/00* (2006.01)
*H01L 23/10* (2006.01)

(52) U.S. Cl.
CPC ............ *H01L 24/94* (2013.01); *H01L 23/10* (2013.01); *H01L 24/29* (2013.01); *H01L 24/27* (2013.01); *H01L 24/32* (2013.01); *H01L 24/83* (2013.01); *H01L 2224/2745* (2013.01); *H01L 2224/2746* (2013.01); *H01L 2224/2761* (2013.01); *H01L 2224/27452* (2013.01); *H01L 2224/27616* (2013.01); *H01L 2224/29011* (2013.01); *H01L 2224/29012* (2013.01); *H01L 2224/2919* (2013.01); *H01L 2224/29109* (2013.01);

(Continued)

(58) Field of Classification Search
CPC ................. H01L 21/30; H01L 51/5246; H01L 2224/29035; H01L 2224/3207; H01L 23/10; H01L 24/94; H01L 24/29; B81C 1/00269; B81C 2203/0118; B81C 2203/019
USPC .. 257/688, 689, 777, 778, E23.127, E23.18; 438/107, 445
See application file for complete search history.

(56) References Cited

U.S. PATENT DOCUMENTS 5,773,986 A     6/1998  Thompson et al.
6,661,084 B1 *  12/2003  Peterson ............... H01L 25/105
                                                        257/680

(Continued)

FOREIGN PATENT DOCUMENTS

CN    101159260 A    4/2008

*Primary Examiner* — Eric Ward
*Assistant Examiner* — Eric Ashbahian
(74) *Attorney, Agent, or Firm* — Slater Matsil, LLP (57) ABSTRACT

A wafer seal ring may be formed on a wafer having a pattern structure with a pattern density. The wafer seal ring pattern structure may include a plurality of lines having a width and a spacing that may be approximately equal to a width and a spacing of die bond rings on the wafer. The wafer having the wafer seal ring formed thereon may be bonded to a wafer that may not have a wafer seal ring. A pair of wafers may be formed with respective wafer seal rings formed in a corresponding manner. The pair of wafers may be bonded together with the wafer seal rings aligned and bonded together to form a seal ring structure between the bonded wafers.

20 Claims, 6 Drawing Sheets

(52) U.S. Cl.
CPC ............... *H01L 2224/29111* (2013.01); *H01L 2224/29124* (2013.01); *H01L 2224/29144* (2013.01); *H01L 2224/29147* (2013.01); *H01L 2224/29155* (2013.01); *H01L 2224/32145* (2013.01); *H01L 2224/83193* (2013.01); *H01L 2224/83201* (2013.01); *H01L 2224/83203* (2013.01); *H01L 2224/94* (2013.01); *H01L 2924/01322* (2013.01); *H01L 2924/15787* (2013.01)

(56) References Cited

U.S. PATENT DOCUMENTS

| | | |
|---|---|---|
| 7,683,478 B2 | 3/2010 | Chen et al. |
| 7,871,857 B1 | 1/2011 | Lei et al. |
| 8,485,416 B2 * | 7/2013 | Ebefors et al. ............ 228/122.1 |
| 8,736,039 B2 | 5/2014 | Wu et al. |
| 8,736,045 B1 | 5/2014 | Gooch et al. |
| 2004/0014308 A1 * | 1/2004 | Kellar ..................... H01L 24/13 438/612 |
| 2007/0105370 A1 * | 5/2007 | Kinderknecht ..... B81C 1/00269 438/637 |
| 2008/0032484 A1 * | 2/2008 | Diep et al. .................... 438/455 |
| 2008/0237823 A1 * | 10/2008 | Martin ......................... 257/685 |
| 2012/0049978 A1 * | 3/2012 | Pang ................... H03H 9/0571 333/189 |
| 2012/0096813 A1 | 4/2012 | Gooch et al. |
| 2012/0097733 A1 * | 4/2012 | Ebefors et al. ............... 228/175 |
| 2012/0223788 A1 * | 9/2012 | Altunkilic et al. ........... 333/175 |
| 2012/0280401 A1 * | 11/2012 | Tsutsue et al. ............... 257/774 |
| 2013/0058202 A1 | 3/2013 | Chou et al. |
| 2014/0124899 A1 | 5/2014 | Gooch et al. |
| 2014/0217557 A1 | 8/2014 | Chen et al. |

\* cited by examiner

METHOD AND APPARATUS FOR A WAFER SEAL RING

CROSS REFERENCE TO RELATED APPLICATIONS

The present application is related to co-pending U.S. patent application Ser. No. 13/759,549, entitled "Method and Apparatus for a Seal Ring Structure," filed on Feb. 5, 2013, commonly assigned to the assignee of the present application, which application is incorporated by reference herein.

BACKGROUND

In a semiconductor manufacturing process, integrated circuits are fabricated within dies on a semiconductor wafer. The semiconductor wafer goes through many processing steps before the dies are separated by cutting the semiconductor wafer. The processing steps can include lithography, etching, doping, grinding, and/or depositing different materials. The processing steps can include wet and dry processing steps. Semiconductor wafers can be stacked or bonded on top of each other and separated along scribe lines to form what is referred to as a three-dimensional ("3D") IC. The aforementioned processing steps can also be performed on bonded wafers. Contaminants, chemicals or residue from various processing steps that penetrate the die area of bonded wafers can limit production yield of dies formed therein.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1A:
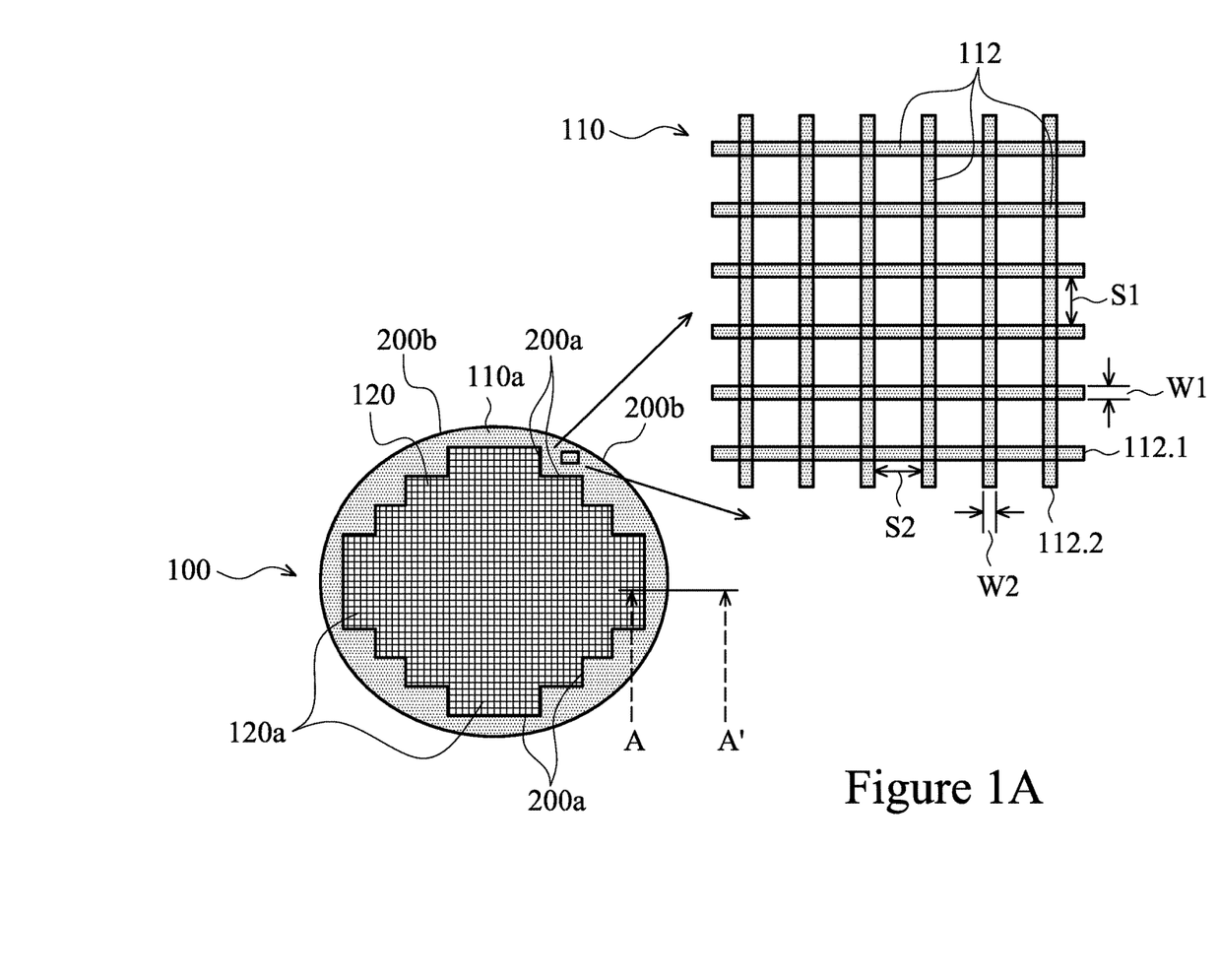
FIG. 1A illustrates a plan view of a wafer seal ring according to an embodiment.

FIG. 1A, illustrates a plan view of a wafer seal ring 110 according to an embodiment. As illustrated in FIG. 1A, the wafer seal ring 110 may be formed on a wafer 100 within a seal ring area 110a (shaded). The wafer 100 may have one or more dies 120 formed thereon. The area of the wafer 100 that may include the one or more dies 120 may be referred to as an effective die area 120a of the wafer 100. The seal ring area 110a may be related to the effective die area 120a. For example, the seal ring area 110a may be an unused portion surrounding the effective die area 120a for the wafer 100.

It is understood that the effective die area 120a may vary depending on the number of dies 120 that may be formed on the wafer 100. Thus, a shape of the seal ring area 110a may be irregular depending on the effective die area 120a for the wafer 100. The effective die area 120a as shown in FIG. 1A is provided for illustrative purposes only and is not meant to limit the scope of the embodiments described herein. Scribe lines (not shown) may be formed between the dies 120, which may provide a mechanism for singulation of the dies 120 from the wafer 100.

As illustrated in FIG. 1A, the wafer seal ring 110 may be formed according to a pattern structure 112. The pattern structure 112 as shown in FIG. 1A may include a plurality of first structure portions 112.1 and a plurality of second structure portions 112.2. The first structure portions 112.1 may be separated by a first spacing S1 and may be formed to a first width W1. The second structure portions 112.2 may be separated by a second spacing S2 and may be formed to a second width W2. The first and second structure portions 112.1, 112.2 may also be referred to as first and second "lines" having the above described widths and spacing that may create the pattern structure 112. Although the first and second spacing S1, S2 of the respective first and second structure portions 112.1, 112.2 is illustrated as having a regular spacing, the first and/or second spacing S1, S2 may also be formed with an irregular spacing.

The first and second structure portions 112.1, 112.2 as shown in FIG. 1A may intersect to form the pattern structure 112. For example, the pattern structure 112 as shown in FIG. 1A illustrates a square-shaped pattern. Although FIG. 1A illustrates approximately perpendicular intersection angles between the first and second structure portions 112.1, 112.2 to form the square-shaped pattern, other intersection angles may be formed that are not approximately perpendicular. As shown in FIG. 1A, a periphery of the wafer seal ring 110 (e.g. an outermost boundary 200b of the wafer seal ring 110) may be co-terminus with a periphery of the first wafer 100. In the example shown in FIG. 1A, each of the first structure portions 112.1 is a single straight line segment that physically contacts an innermost boundary 200a of the wafer seal ring 110. Each of the single straight line segments of the first structure portions 112.1 also extends towards the outermost boundary 200b of the wafer seal ring 110 and physically contacts the outermost boundary 200b of the wafer seal ring 110. Similarly, each of the second structure portions 112.2 is a single straight line segment that physically contacts the innermost boundary 200a of the wafer seal ring 110. Each of the single straight line segments of the second structure portions 112.2 also extends towards the outermost boundary 200b of the wafer seal ring 110 and physically contacts the outermost boundary 200b of the wafer seal ring 110. In various embodiments, the intersection angles may be acute and/or obtuse as determined by a wafer designer to form diamond-shaped or trapezoidal-shaped patterns. In other embodiments, structure portions may not intersect but rather may be formed with additional structure portions (not shown) to create polygonal-shaped pattern structures.

The pattern structure 112, including the first and second structure portion widths W1, W2, and corresponding first and second spacing S1, S2 may be formed such that a comparable effective bonding pressure may be applied at an interface point (also referred to herein as the "contact interface") across the effective die area 120a and the seal ring area 110a during operations in which the wafer 100 may be bonded to another wafer (not shown). For example, die bond rings (not shown) may be formed, which may encircle each of the one or more dies 120 formed within effective die area 120a. The die bonding rings may create a die bond ring pattern density (not shown) for the effective die area 120a. The first and second structure portion widths W1, W2 and the first and second structure portion spacing S1, S2 may be sized to provide a pattern density for the pattern structure 112 of the wafer seal ring 110 that may be related to the die bond ring pattern density.

For example, the first and second structure portions 112.1, 112.2 may be formed to first and second widths W1, W2 and separated by a first and second spacings S1, S2 that may be approximately equal to a corresponding width and spacing of die bonding rings (not shown) on the wafer 100. By relating the pattern density for the pattern structure 112 of the wafer seal ring 110 to the die bond ring pattern density, an approximately uniform effective bonding pressure may be applied across the wafer 100 during a bonding process for bonding the wafer 100 to another wafer (not shown). Effective bonding pressure is discussed in more detail below with respect to FIG. 1B.

In an embodiment, the wafer seal ring 110 may be formed concurrently with the die bond rings (not shown). The relationship between the pattern densities of the die bond rings (not shown) in the effective die area 120a and the pattern structure 112 of the wafer seal ring 110 is discussed in more detail below.

In another embodiment, the wafer seal ring 110 may be formed both in the seal ring area 110a and in the effective die area 120a of the wafer 100. Within the effective die area 120a of the wafer 100, the wafer seal ring 110 may be formed about scribe lines (not shown) and/or separation areas (not shown) that may be provided between the dies 120. In this manner, the widths and/or spacings of the wafer seal ring 110 and die bond rings (not shown) may be approximately equal across the entire wafer 100. By approximately equal, it is meant that a person of ordinary skill in the art may recognize that the widths and/or spacing of the wafer seal ring and the die bond rings may be sized to provide for or enhance uniformity of the effective bonding pressure that may be applied across the wafer 100 during a wafer bonding process.

In yet another embodiment, dies 120 may be formed in the seal ring area 110a in addition to the effective die area 120a. In such an embodiment, the wafer seal ring 110 may be formed about scribe lines (not shown) and/or separation areas (not shown) that may be provided between the dies 120 in the seal ring area 110a. In this manner, the widths and/or spacing of the wafer seal ring 110 and die bond rings (not shown) may be approximately equal across the entire wafer 100. By approximately equal, it is meant that a person of ordinary skill in the art may recognize that the widths and/or spacing of the wafer seal ring and the die bond rings may be sized to provide for or enhance uniformity of the effective bonding pressure that may be applied across the wafer 100 during a wafer bonding process.

In various embodiments, the wafer seal ring 110 may be a eutectic alloy such as AlCu, AlGe or other like material. In an embodiment, the wafer seal ring may be formed of a polymer. In various embodiments, the wafer seal ring 110 may be a low-melting point metal layer such as In, Au, Sn, Ni, Cu or other like material. Eutectic alloys or low-melting point metal layers may be formed by thermal chemical vapor deposition ("CVD"), physical vapor deposition ("PVD") such as sputtering or evaporation, electron gun, ion beam, energy beam, plating, one or more subtractive etch processes, single Damascene techniques, and/or dual-Damascene techniques, the like or other acceptable methods.

In an embodiment, for example, the first and second structure portions 112.1, 112.2 may be formed using one or more subtractive etch processes. In various embodiments, the first and second structure portions 112.1, 112.2 may be formed in one or more successive processing steps as determined by a wafer designer.

In various embodiments, the wafer 100 may be a substrate or an interposer. In an embodiment, the wafer 100 may comprise bulk silicon. In other embodiments, the wafer 100 may comprise any semiconductor substrate, ceramic substrate, quartz substrate or the like. In some embodiments, the wafer 100 may comprise a silicon-on-insulator ("SOI") or other like substrate. Other substrates that may be used include multi-layered substrates, gradient substrates, or hybrid orientation substrates.

Figure 1B:
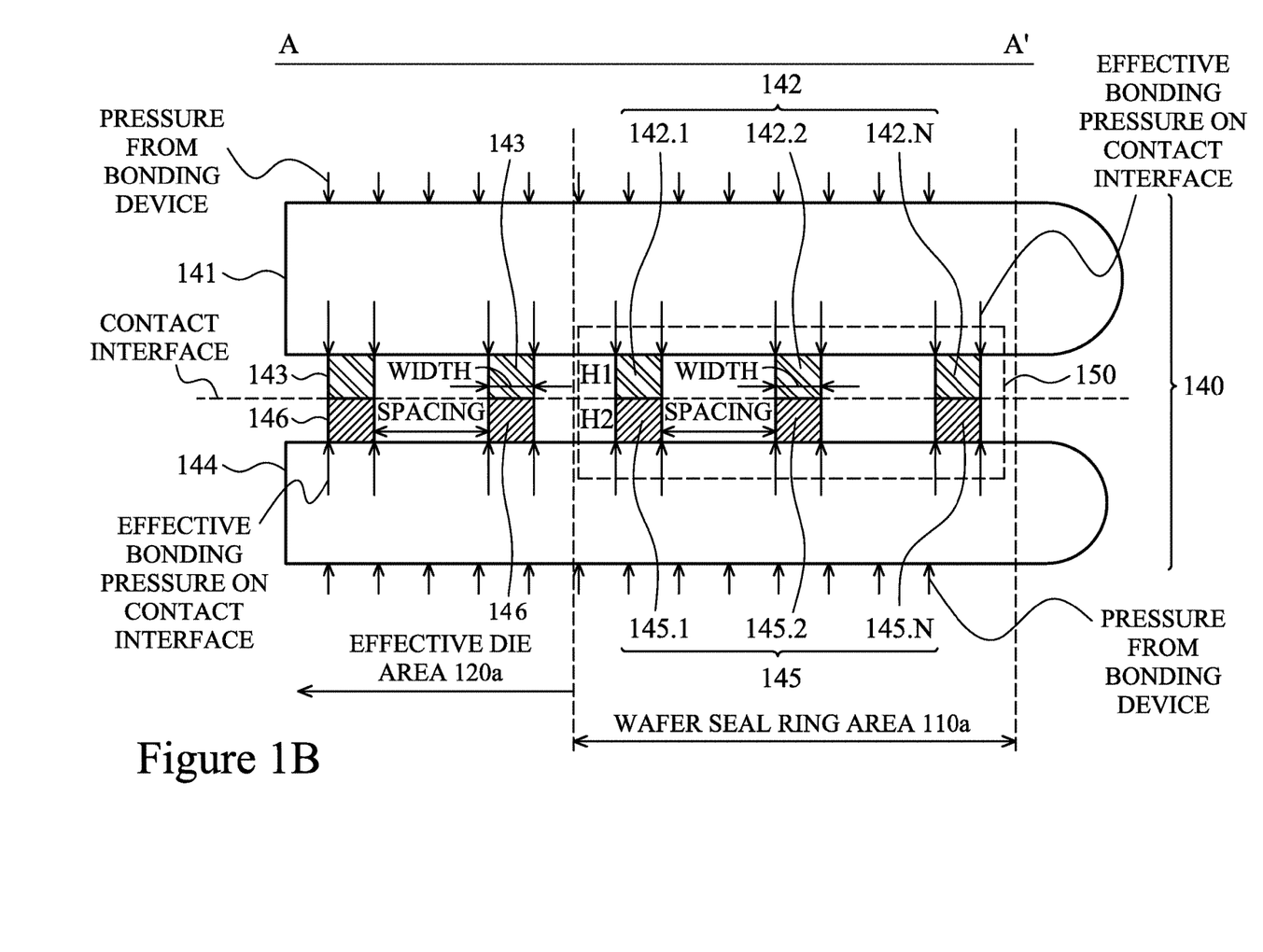
FIG. 1B illustrates a cross-sectional view of a pair of wafer seal rings along line A-A' of FIG. 1A for a pair of bonded wafers according to an embodiment.

FIG. 1B illustrates a cross-sectional view of a pair of wafer seal rings along line A-A' of FIG. 1A for a bonded structure 140 according to an embodiment. As shown in FIG. 1B, the bonded structure 140 may include a first wafer 141 including a first wafer seal ring 142 and a second wafer 144 including a second wafer seal ring 145 bonded together to form a seal ring structure 150. The first wafer seal ring 142 may include a plurality of first structure portions 142.1-142.N having a corresponding width and being separated by a corresponding spacing. The second wafer seal ring 145 may include a plurality of second structure portions 145.1-145.N having a corresponding width and being separated by a corresponding spacing.

The first wafer 141 may include a plurality of first die bond rings 143. The first die bond rings 143 may encircle dies (not shown), that may be present on the first wafer 141. The second wafer 144 may include second die bond rings 146. The second die bond rings 146 may encircle dies (not shown) that may be present on the second wafer 144. The first wafer seal ring 142 may be formed to a first height H1. The second wafer seal ring 145 may be formed to a second height H2.

In various embodiments, the first and/or second wafer seal rings 142, 145 as shown in FIG. 1B may be formed of, for example, of one or more eutectic alloys such as AlCu, AlGe, low-melting point metal layers such as In, Au, Sn, Ni, Cu or other like material. In various embodiments, the first and second die bond rings 143, 146 and the first and second wafer seal rings 142, 145 may be formed of the same or similar materials. The first and second height H1, H2 of the respective first and second wafer seal rings 142, 145 may be uniform with heights (not labeled) of the respective first and second die bond rings 143, 146.

As illustrated in FIG. 1B, the width and spacing of the first structure portions 142.1-142.N may be approximately equal to the width and the spacing of the second structure portions 145.1-145.N such that, when the first and second wafers 141, 144 are aligned for bonding, the respective first and second wafer seal rings 142, 145 and their corresponding structure portions may be aligned and bonded to form the seal ring structure 150. Thus, the first and second wafer seal rings 142, 145 may be formed having respective first and second pattern structures (not shown) that may be (approximately) minor images of one another. The interface point or contact interface may be the location(s) at which the first and second wafer seal rings 142, 145 and the first and second die bond rings 143, 146 may contact each other during a process for bonding the first and second wafers 141, 144.

In an illustrative example, the first and second wafers 141, 144 may be bonded together using an external bonding device (not shown), which may apply a pressure and/or heat to the wafers. The pressure may be spread over a surface of each wafer, the surface being opposite the contact interface between the first and second wafers 141, 144.

As shown in FIG. 1B, the width and spacing of the corresponding first structure portions 142.1-142.N and the corresponding second structure portions 145.1-145.N for the respective first and second seal rings 142, 145 may be related to the width and spacing of the first and second die bond rings 143, 146 on the respective first and second wafers 141, 144. In this manner, as discussed above, a pattern structure (not shown in FIG. 1B) of the first and second wafer seal rings 142, 145 may be related to a pattern structure (not shown in FIG. 1B) of the first and second die bond rings 143, 146. Further, the first and second height H1, H2 of the first and second wafer seal rings 142, 145 may be uniform with the corresponding heights of the respective first and second die bond rings 143, 146. Accordingly, an effective bonding pressure as shown in FIG. 1B may be applied along the contact interface between the first and second wafers 141, 144 in an approximately uniform manner across the effective die area 120a and the wafer seal ring area 110a during a bonding process. Although FIG. 1B illustrates a regular spacing for the first and second wafer seal ring 142, 145 structure portions, the spacing may also be irregular as related to the first and second die bond ring 143, 146 spacing.

The approximately uniform effective bonding pressure may result in the formation of a good hermetic seal via the seal ring structure 150 between the first and second wafers 141, 144. Previous techniques for creating a seal between bonded wafers utilized the entirety of the unused portion of an effective die area to form a wafer seal ring. This previous technique resulted in an irregularly shaped, singular seal ring having a form that was unrelated to a die bond ring pattern density of an effective die area of a wafer. Thus, for the previous techniques, the effective bonding pressure along the contact interface between the effective die area and the wafer seal ring area of a pair of wafers was not uniform, which often resulted in a poorly-bonded seal between the wafers.

Moreover, the seal ring of the previous techniques was often singular in nature, e.g., merely the remainder of the non-die area of a wafer. Thus, a single opening or poor bond in one area of a seal ring formed according to previous techniques compromised the integrity of devices, dies and/or die bond rings formed in the effective die area of a pair of bonded wafers during subsequent processing steps. For example, one of a bonded wafer may be thinned through a chemical mechanical polishing ("CMP") processing step or may be etched in an etching processing step. If a seal ring formed according to the previous techniques became separated or un-bonded during such subsequent processing steps contaminants, chemicals or reside could damage devices, dies and/or die bond rings in the wafer die areas.

In contrast, the wafer seal ring(s) as described herein according to the present embodiments may include multiple structure portions or lines (e.g., portions 112.1, 112.2 as shown in FIG. 1A). The multiple structure portions of a wafer seal ring according to the present embodiments may provide two-fold advantages over seal rings of previous techniques. First, as discussed above, the multiple structure portions or lines of a wafer seal ring according to the present embodiments may create a pattern density that may be approximately equal to die bond ring pattern densities in the effective die area. In this manner, wafer seal rings according to the present embodiments may provide for or enhance the uniformity of the effective bonding pressure that may be applied along a contact interface between a between a pair of wafers across the effective die area and the wafer seal ring area during a bonding process. This may result in a seal ring structure between the bonded wafers having good hermetic sealing properties. In another, embodiment, as discussed above, the wafer seal ring may be formed across an entire wafer, thus providing a uniform pattern density across the entire wafer, which may further provide for or enhance uniformity of the effective bonding pressure for bonding a pair of wafers.

Second, the multiple structure portions of a wafer seal ring according to the present embodiments may provide redundant protective layers or barriers for a seal ring structure. Therefore, if say, one of a structure portion may become separated or un-bonded in a localized area, the integrity of a seal ring structure may not be compromised, even for the localized area where a separation may occur. The remaining bonded structural portions may provide multiple, redundant protection layers, thus, the integrity of devices, dies and/or die bond rings formed in the effective die area may be maintained through subsequent processing steps for a bonded structure.

Figure 2:
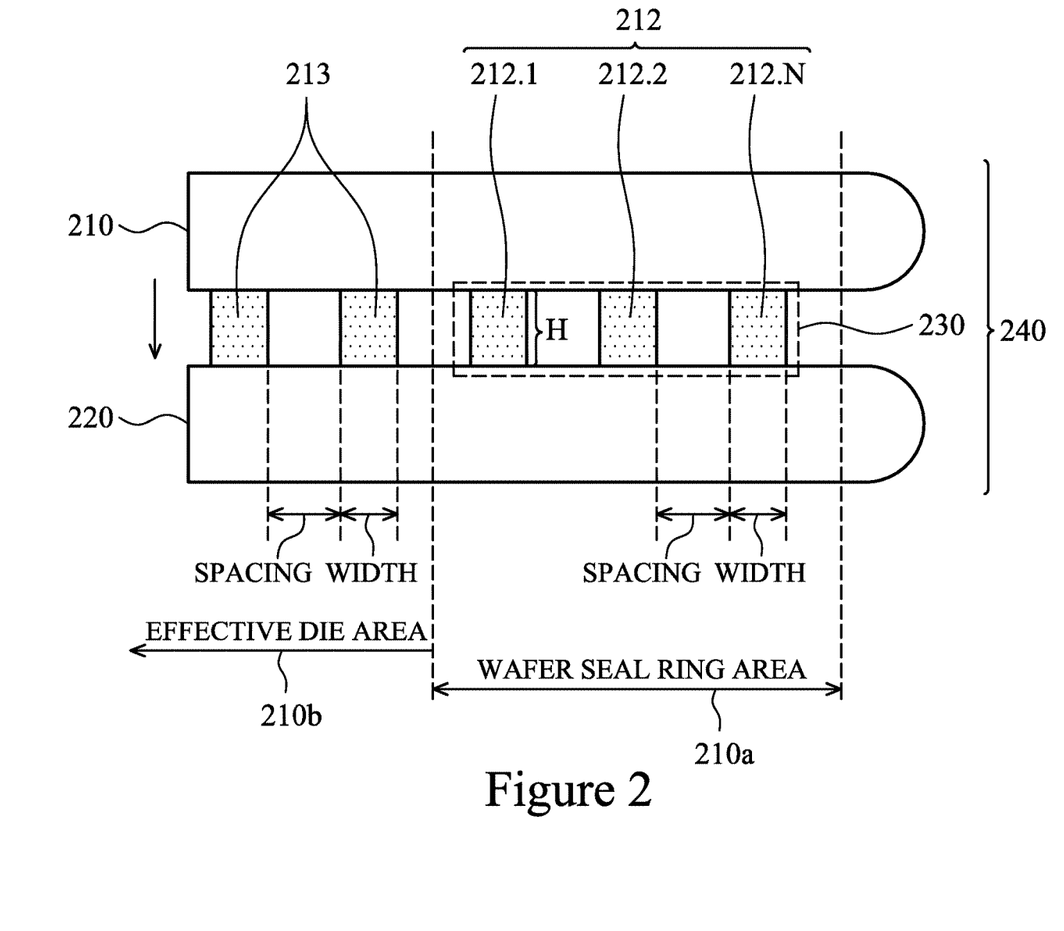
FIG. 2 illustrates a cross-sectional view of a wafer seal ring for a bonded structure according to another embodiment.

FIG. 2 illustrates a cross-sectional view of a wafer seal ring for a bonded structure according to another embodiment. As shown in FIG. 2, a first wafer 210 may include a wafer seal ring 212 and a die bond ring 213 that may encircle a die (not shown) present on the first wafer 210. In an embodiment, the wafer seal ring 212 may be formed in a wafer seal ring area 210a of the first wafer 210, while the die bond ring 213 may be formed in an effective die area 210b of the first wafer. In contrast to the bonded structure 140 of FIG. 1B, above, which illustrates a pair of wafer seal rings 142, 145 formed on the first and second wafers 141, 144, the bonded structure 240 of FIG. 2 illustrates the wafer seal ring 212 may be formed only on one wafer (e.g., first wafer 210), which may be used to provide sealing for the bonded structure 240.

The first wafer 210 may be bonded to a second wafer 220 to form a bonded structure 240. Bonding the first wafer 210 to the second wafer 220 may form a seal ring structure 230 between the first and second wafer 210, 220.

The wafer seal ring 212 may include a plurality of structure portions 212.1-212.N having a corresponding width and being separated by a corresponding spacing. The wafer seal ring 212 may be formed to a height H. In an embodiment, as shown in FIG. 2, the width and spacing of the corresponding structure portions 212.1-212.N may be related to the width and spacing of the die bond ring 213. In an embodiment, the wafer seal ring 212 may be formed concurrently with the die bond ring 213.

In another embodiment, a wafer seal ring 212 may be formed in place of die bond ring 213 such that the wafer seal ring 212 may be formed within both the effective die area 210b as well as the wafer seal ring area 210a. For example, the wafer seal ring may be formed about scribe lines (not shown) and/or separation areas (not shown) that may be provided between the dies (not shown) within the effective die area 210b. In this manner, the wafer seal ring 212 may be uniformly formed across the entirety of the first wafer 210, which may enhance the uniformity of the effective bonding pressure that may be applied across the wafer 210 during a bonding process for bonding the first wafer 210 to the second wafer 220.

In various embodiments, the wafer seal ring 212 formed of, for example, of one or more eutectic alloys such as AlCu, AlGe, low-melting point metal layers such as In, Au, Sn, Ni, Cu or other like material, or a polymer.

Figure 3A:
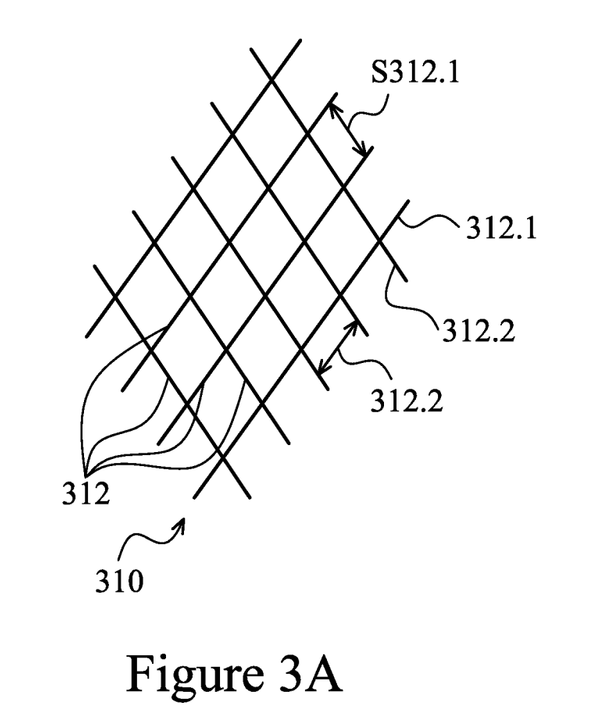
FIGS. 3A-3B illustrate pattern structures for wafer seal rings according to various embodiments.
Figure 3B:
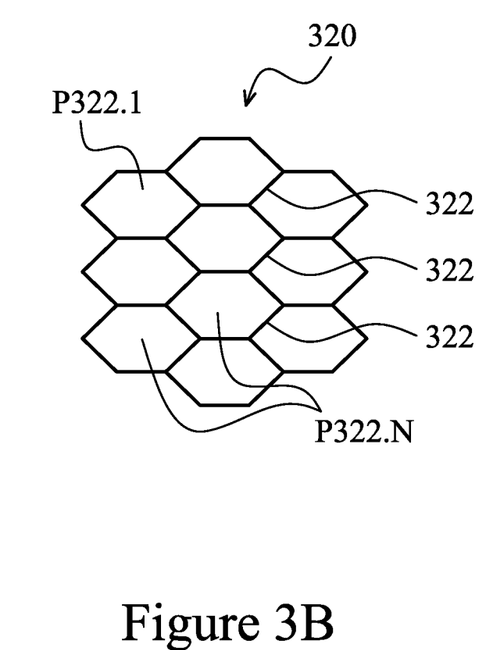

FIGS. 3A-3B illustrate pattern structures for wafer seal rings according to various embodiments. As illustrated in FIG. 3A, a wafer seal ring 310 may be formed with a pattern structure 312 may having a diamond-shaped pattern. The pattern structure 312 may include a plurality of first structure portions 312.1 and a plurality of second structure portions 312.2. The first and second structure portions 312.1, 312.2 may be formed having first and second widths (not shown). The first plurality of structure portions 312.1 may be separated by a first spacing S312.1. The second plurality of structure portions 312.2 may be separated by a second spacing S312.2. The pattern structure 312 may be formed to have a pattern density that may be related to a pattern density for die bond rings (not shown) that may be formed within an effective die area of a wafer (not shown). The first and/or second spacing 312.1, 312.2 may be formed to have a regular or an irregular spacing.

The plurality of first and/or second structure portions 312.1, 312.2 may be formed by, for example, thermal chemical vapor deposition ("CVD"), physical vapor deposition ("PVD") such as sputtering or evaporation, electron gun, ion beam, energy beam, plating, one or more subtractive etch processes, single Damascene techniques, and/or dual-Damascene techniques, the like or other acceptable methods.

As illustrated in FIG. 3B, a wafer seal ring 320 may be formed with a pattern structure 322 having a polygon-like pattern. The polygon-like pattern may include a plurality of interconnected polygons P322.1-P322.N, as shown in FIG. 3B. The pattern structure 322 may be formed to have a pattern density that may be related to a pattern density for die bond rings (not shown) that may be formed within an effective die area of a wafer (not shown). The pattern structure 322 may be formed by, for example, thermal chemical vapor deposition ("CVD"), physical vapor deposition ("PVD") such as sputtering or evaporation, electron gun, ion beam, energy beam, plating, one or more subtractive etch processes, single Damascene techniques, and/or dual-Damascene techniques, the like or other acceptable methods.

Figure 4:
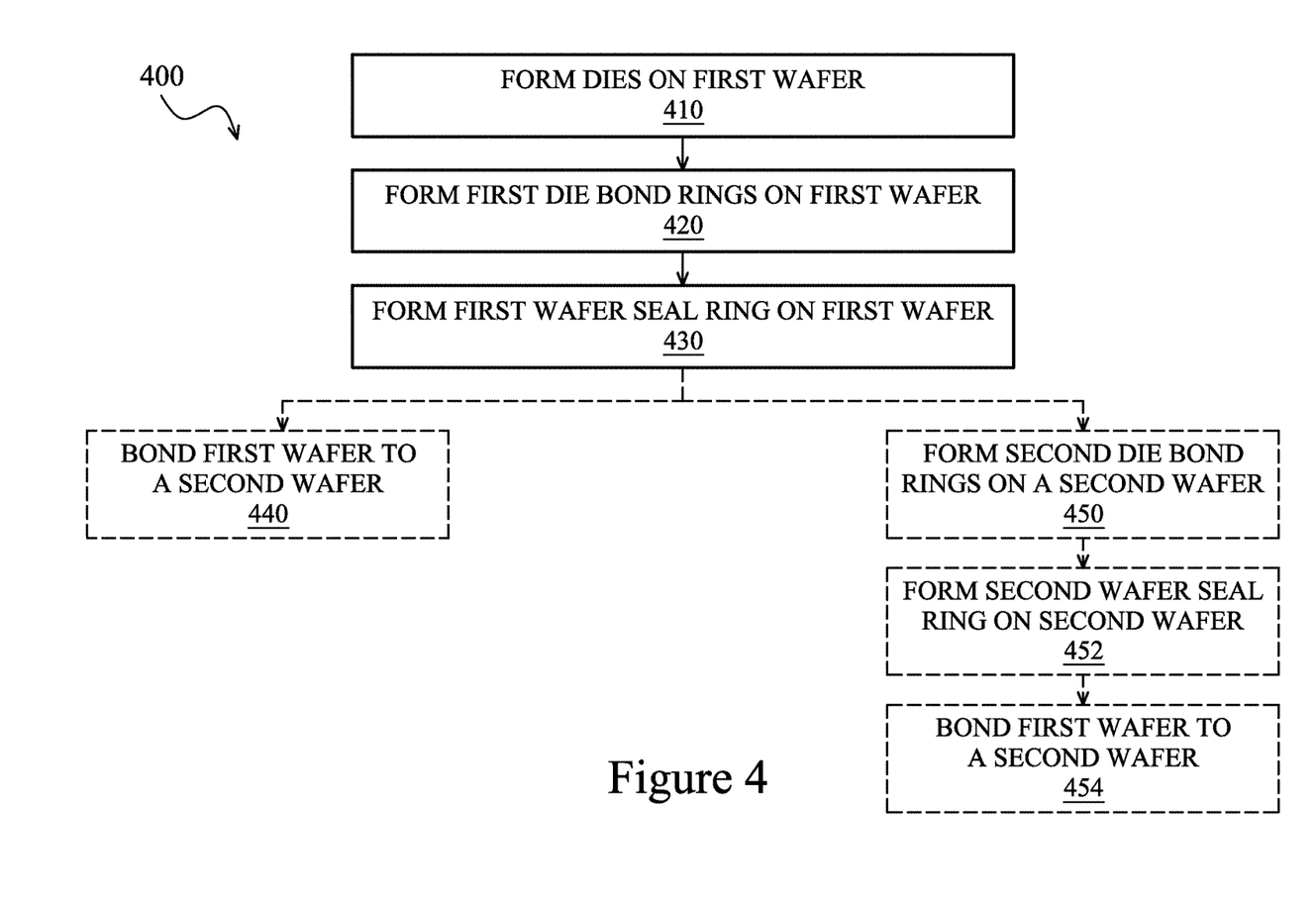
FIG. 4 illustrates a method of forming a device according to an embodiment.

FIG. 4 illustrates a method 400 for forming a device according to an embodiment. As shown in block 410, the method 400 may form a first plurality of dies on a first wafer. In an embodiment, the dies may be formed in an effective die area for the first wafer. As shown in block 420, the method 400 may form a plurality of first die bond rings on the first wafer. The first die bond rings may be formed having a first width and a first spacing. As shown in block 430, the method 400 may form a first wafer seal ring on the first wafer. The first wafer seal ring may be formed having plurality of lines having a second width and a second spacing. The second width and the second spacing of the first wafer seal ring may be approximately equal to the first width and the first spacing of the first die bond rings. In an embodiment, the plurality of first die bond rings may be formed concurrently with the first wafer seal ring. In an embodiment, the method 400 may bond the first wafer to a second wafer (block 440).

In another embodiment, the method 400 may form a plurality of second die bond rings on a second wafer (block 450). The second die bond rings may have a third width and third spacing. The third width and third spacing may align with the first width and first spacing of the first die bond ring on the first wafer. The method 400 may form a second wafer seal ring on the second wafer (block 452). The second wafer seal ring may be formed having a plurality of lines having a fourth width and fourth spacing. The fourth width and fourth spacing of the second wafer seal ring may align with the second width and the second spacing of the first wafer seal ring. The method 400 may bond the first wafer to the second wafer to form a bonded structure (block 454).

Figure 5:
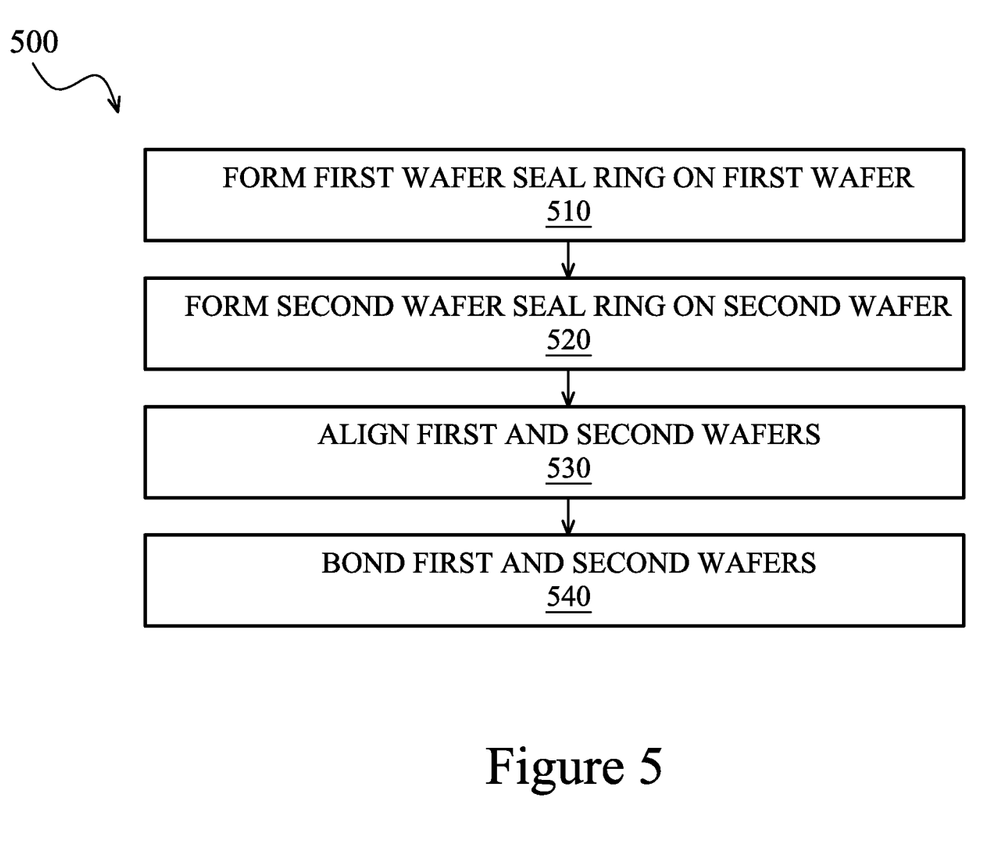
FIG. 5 illustrates another method of forming another device according to another embodiment.

FIG. 5 illustrates another method 500 for forming another device according to another embodiment. As shown in block 510, the method 500 may form a first wafer seal ring on a first wafer. The first wafer seal ring may a first plurality of lines having a first width and a first spacing. The method 500 may form a second wafer seal ring on a second wafer (block 520). The second wafer seal ring may have a second plurality of lines having a second width and a second spacing. The first width and first spacing of the first plurality of lines of the first wafer seal ring may be approximately equal to the corresponding second width and second spacing of the second plurality of lines of the second wafer seal ring. The widths and spacing may be approximately equal such that one of ordinary skill in the art may recognize that the widths and spacing may be sized to provide for or enhance the uniformity of bonding pressure across the wafers during bonding. The method may align the first wafer to the second wafer (block 530). The method 500 may bond the first wafer to the second wafer (block 540).

In an embodiment, a cross-section of the first width and the first spacing of the first plurality of lines of the first wafer seal ring may be formed to be approximately equal to a cross-section of a width and a spacing of die bond rings formed on the first wafer. In an embodiment, the method 500 may form the first plurality of lines to a first height that may be approximately equal to a height of the die bond rings formed on the first wafer. In an embodiment, a cross-section of the second width and the second spacing of the second plurality of lines of the second wafer seal ring may be formed to be approximately equal to a cross-section of a width and a spacing of die bond rings formed on the second wafer. In an embodiment, the method 500 may form the second plurality of lines to a second height that may be approximately equal to a height of the die bond rings formed on the first wafer.

In an embodiment, the method 500 may apply a heat and/or a pressure to the first and second wafer to bond the first wafer to the second wafer. In an embodiment, the method 500 may form the first plurality of lines to intersect in a square-shaped pattern on the first wafer. In another embodiment, the method 500 may form the first plurality of lines to intersect in a diamond-shaped pattern on the first wafer. In yet another embodiment, method 500 may form the first plurality of lines in a polygon-shaped pattern.

In an embodiment, a method is provided. The method may comprise forming a first plurality of dies on a first wafer in a die area for the first wafer; forming a first plurality of die bond rings on the first wafer, the first plurality of die bond rings having a first width and a first spacing; and forming a first wafer seal ring on the first wafer in a seal ring area of the wafer, the first wafer seal ring having a plurality of lines having a second width and a second spacing, wherein a cross-section of the first width and the first spacing of the first plurality of die bond rings is approximately equal to the second width and the second spacing of the first wafer seal ring.

In another embodiment, another method is provided. The method may comprise forming a first plurality of dies on substantially the entirety of a first wafer; forming a first plurality of die bond rings on the first wafer, the first plurality of die bond rings having a first width and a first spacing; and forming a first wafer seal ring on substantially the entirety of the first wafer, the first wafer seal ring having a plurality of lines having a second width and a second spacing, wherein a cross-section of the first width of the first plurality of die bond rings is approximately equal to the second width of the first wafer seal ring.

In an embodiment, another method is provided. The method may comprise forming a first wafer seal ring on a first wafer, the first wafer seal ring having a first plurality of lines having a first width and a first spacing; forming a second wafer seal ring on a second wafer, the second wafer seal ring having a second plurality of lines having a second width and a second spacing, the second width and the second spacing being approximately equal to the first width and the first spacing; aligning the first wafer to the second wafer; and bonding the first wafer to the second wafer.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a first plurality of dies on a first wafer in a die area of the first wafer, the first plurality of dies being arranged laterally adjacent to each other;
   forming a first plurality of die bond rings in the die area of the first wafer, the first plurality of die bond rings encircling each of the first plurality of dies, the first plurality of die bond rings comprising a first polymer material, the first plurality of die bond rings having a first width and a first spacing;
   forming a first wafer seal ring on the first wafer in a seal ring area of the first wafer, the first wafer seal ring comprising a second polymer material, the first wafer seal ring having within an innermost boundary the first plurality of die bond rings and the first plurality of dies, the innermost boundary of the first wafer seal ring comprising a stair-shaped pattern, the innermost boundary of the first wafer seal ring being symmetrical under 90 degree rotation around a center of the first wafer, an entirety of an outermost boundary of the first wafer seal ring being co-terminus with an entirety of an edge of the first wafer, the first wafer seal ring having a plurality of lines having a second width and a second spacing, wherein a cross-section of the first width and the first spacing of the first plurality of die bond rings is approximately equal to the second width and the second spacing of the first wafer seal ring, wherein each of the plurality of lines physically contacts the innermost boundary of the first wafer seal ring and extends towards the outermost boundary of the first wafer seal ring as a single straight line segment that physically contacts the outermost boundary of the first wafer seal ring, and wherein the first wafer seal ring has a same pattern along the entirety of the edge of the first wafer; and
   forming a second plurality of dies in the seal ring area of the first wafer, wherein the second plurality of dies are interposed between the innermost boundary of the first wafer seal ring and the outermost boundary of the first wafer seal ring, and wherein the first wafer seal ring is disposed along a plurality of scribe lines in the seal ring area of the first wafer.

2. The method of claim 1, wherein the first plurality of die bond rings are formed to a first height and the first wafer seal ring is formed to a second height, the first height being approximately equal to the second height.

3. The method of claim 1, further comprising:
   bonding the first wafer to a second wafer.

4. The method of claim 1, wherein the first wafer seal ring is made of a eutectic alloy or a low-melting point metal.

5. The method of claim 1, wherein the entirety of the outermost boundary of the first wafer seal ring is spaced apart from the entirety of the innermost boundary of the first wafer seal ring.

6. The method of claim 1, wherein the stair-shaped pattern comprises a plurality of line segments, and wherein adjacent line segments of the plurality of line segments are connected to one another at a right angle.

7. The method of claim 1, wherein the first plurality of die bond rings forms a grid in the die area of the first wafer.

8. A method comprising:
   forming a first plurality of dies on a first wafer, the first plurality of dies being spaced apart from each other;
   forming a first plurality of die bond rings on a first surface of the first wafer, the first plurality of die bond rings encircling each of the first plurality of dies, the first plurality of die bond rings comprising a first polymer material, the first plurality of die bond rings having a first width and a first spacing;
   forming a first wafer seal ring on the first surface of the first wafer, wherein the first wafer seal ring comprises a second polymer material, wherein an entirety of a periphery of the first wafer is co-terminus with an entirety of an outermost periphery of the first wafer seal ring, the first wafer seal ring having within an innermost periphery the first plurality of dies and the first plurality of die bond rings, the innermost periphery of the first wafer seal ring having a stair-shaped pattern in each quadrant of the first wafer, respective stair-shaped patterns of the innermost periphery of the first wafer seal ring in adjacent quadrants of the first wafer having similar shapes up to 90 degree rotation around a center of the first wafer, the first wafer seal ring having a plurality of lines having a second width and a second spacing, wherein a cross-section of the first width of the first plurality of die bond rings is approximately equal to the second width of the first wafer seal ring, and wherein each of the plurality of lines of the first wafer seal ring physically contacts the innermost periphery of the first wafer seal ring and extends towards the outermost periphery of the first wafer seal ring as a single straight line segment that physically contacts the outermost periphery of the first wafer seal ring, and wherein the first wafer seal ring has a uniform pattern along the entirety of the periphery of the first wafer; and forming a second plurality of dies on the first wafer, wherein the second plurality of dies are interposed between the innermost periphery of the first wafer seal ring and the outermost periphery of the first wafer seal ring, and wherein the first wafer seal ring is disposed along a plurality of scribe lines in a seal ring area of the first wafer.

9. The method of claim 8, wherein the first plurality of die bond rings are formed to a first height and the first wafer seal ring is formed to a second height, the first height being approximately equal to the second height.

10. The method of claim 8, further comprising:
bonding the first wafer to a second wafer.

11. The method of claim 8, further comprising:
forming a second wafer seal ring on a second wafer, the second wafer seal ring having a plurality of lines having a third width and a third spacing, wherein the third width and the third spacing are approximately equal to the second width and the second spacing of the first wafer seal ring.

12. The method of claim ii, further comprising:
aligning the first wafer to the second wafer; and
bonding the first wafer to the second wafer.

13. The method of claim 8, wherein the stair-shaped pattern comprises a plurality of line segment pairs, wherein each of the plurality of line segment pairs comprises a first line segment connected to a second line segment, and wherein the first line segment is perpendicular to the second line segment.

14. A method comprising:
forming a first wafer seal ring on a first wafer, the first wafer seal ring comprising a first polymer material, the first wafer seal ring having within its innermost boundary a first plurality of die bond rings and a first plurality of integrated circuit dies arranged laterally adjacent to each other, the first plurality of die bond rings comprising a second polymer material, the first plurality of die bond rings encircling each of the first plurality of integrated circuit dies, the first wafer seal ring having a first plurality of lines having a first width and a first spacing, wherein each of the first plurality of lines physically contacts the innermost boundary of the first wafer seal ring and extends towards an outermost boundary of the first wafer seal ring and physically contacts the outermost boundary of the first wafer seal ring, and wherein a cross-section of the first width and the first spacing of the first plurality of lines of the first wafer seal ring is approximately equal to a cross-section of a width and a spacing of the first plurality of die bond rings on the first wafer;

forming a second plurality of integrated circuit dies on the first wafer, wherein the second plurality of integrated circuit dies are interposed between the innermost boundary of the first wafer seal ring and the outermost boundary of the first wafer seal ring, and wherein the first wafer seal ring is disposed along a plurality of scribe lines of the first wafer;

forming a second wafer seal ring on a second wafer, the second wafer seal ring comprising a third polymer material, the second wafer seal ring having within its innermost periphery a second plurality of die bond rings formed on the second wafer and a third plurality of integrated circuit dies formed on the second wafer, the second plurality of die bond rings comprising a fourth polymer material, the second plurality of die bond rings encircling each of the third plurality of integrated circuit dies, the second wafer seal ring having a second plurality of lines having a second width and a second spacing, the second width and the second spacing being approximately equal to the first width and the first spacing;

aligning the first wafer to the second wafer; and
bonding the first wafer to the second wafer.

15. The method of claim 14, the bonding further comprising:
applying a pressure to the first and second wafers.

16. The method of claim 14, the bonding further comprising:
applying a heat to the first and second wafers.

17. The method of claim 14, wherein the first plurality of lines are formed to a height approximately equal to a height of the first plurality of die bond rings on the first wafer.

18. The method of claim 14, wherein the first plurality of lines of the first wafer seal ring intersect in a square-shaped pattern.

19. The method of claim 14, wherein the first plurality of lines of the first wafer seal ring intersect in a diamond-shaped pattern.

20. The method of claim 14, wherein the first plurality of lines of the first wafer seal ring are arranged in a polygon-shaped pattern.

* * * * *

UNITED STATES PATENT AND TRADEMARK OFFICE
CERTIFICATE OF CORRECTION

PATENT NO. : 9,673,169 B2  
APPLICATION NO. : 13/759201  
DATED : June 6, 2017  
INVENTOR(S) : Yi-Chuan Teng

Page 1 of 1

It is certified that error appears in the above-identified patent and that said Letters Patent is hereby corrected as shown below:

In the Claims

In Column 11, Line 27, Claim 12, delete "claim ii" and insert --claim 11--.

Signed and Sealed this  
Thirty-first Day of October, 2017

Joseph Matal  
*Performing the Functions and Duties of the*  
*Under Secretary of Commerce for Intellectual Property and*  
*Director of the United States Patent and Trademark Office*